United States Patent
Watanabe et al.

(10) Patent No.: US 7,491,897 B2
(45) Date of Patent: Feb. 17, 2009

(54) ELECTRONIC EQUIPMENT PROVIDED WITH WIRING BOARD INTO WHICH PRESS-FIT TERMINALS ARE PRESS-FITTED

(75) Inventors: Hiromichi Watanabe, Kobe (JP); Yoshifumi Fukatsu, Kobe (JP); Toshihiro Kasai, Toyota (JP); Naoki Sugita, Tama (JP); Naofumi Saito, Tama (JP); Hiroyuki Yamanaka, Tokyo (JP)

(73) Assignees: Fujitsu Ten Limited, Kobe-shi (JP); Kel Corporation, Tokyo (JP); Shin-Kobe Electric Machinery Co., Ltd., Tokyo (JP)

(*) Notice: Subject to any disclaimer, the term of this patent is extended or adjusted under 35 U.S.C. 154(b) by 17 days.

(21) Appl. No.: 10/675,227

(22) Filed: Sep. 29, 2003

(65) Prior Publication Data

US 2004/0145880 A1 Jul. 29, 2004

(30) Foreign Application Priority Data

Sep. 30, 2002 (JP) ............................. 2002-287552
Sep. 30, 2002 (JP) ............................. 2002-287568

(51) Int. Cl.
*H05K 1/11* (2006.01)
*H01R 12/04* (2006.01)

(52) U.S. Cl. ...................... 174/266; 174/267

(58) Field of Classification Search .......... 174/266, 174/267, 262, 265, 261, 250, 260; 361/803, 361/807, 719, 760; 439/65, 79, 83, 70
See application file for complete search history.

(56) References Cited

U.S. PATENT DOCUMENTS 3,660,726 A  5/1972  Ammon et al.

(Continued)

FOREIGN PATENT DOCUMENTS

GB  1149332  4/1969

(Continued)

OTHER PUBLICATIONS

Patent Abstract of Japan, Publication No. 06-028174, Published on Feb. 4, 1994, in the name of Tanitsu.

(Continued)

*Primary Examiner*—Jeremy C Norris
(74) *Attorney, Agent, or Firm*—Christie, Parker & Hale, LLP

(57) ABSTRACT

In order to suppress the occurrence of damage on a press-fit joining wiring board, a peak value of stress generated on the board in the case of a press-fitting a press-fit terminal into a through-hole is reduced so that it can not exceed the design standard value of the board. In the press-fit terminal in which a body part, retaining part, introducing part and forward end part are integrally formed, a cross-sectional area of the introducing part is reduced to be smaller than that of the retaining part, so that an intensity of the elastic force of the introducing part is decreased to be lower than that of the elastic force of the retaining part. Alternatively, on the wiring board, elastic material is filled into resin for combining sheet-like base material of the board so as to relieve an intensity of stress generated on the board itself.

9 Claims, 9 Drawing Sheets

U.S. PATENT DOCUMENTS

| | | | |
|---|---|---|---|
| 3,671,917 A | 6/1972 | Ammon et al. | |
| 3,676,926 A | 7/1972 | Kendall | |
| 3,783,433 A | 1/1974 | Kurtz et al. | |
| 3,846,741 A * | 11/1974 | Kunkle et al. | 439/82 |
| 3,997,237 A | 12/1976 | White | |
| 4,017,143 A * | 4/1977 | Knowles | 439/873 |
| 4,066,326 A | 1/1978 | Lovendusky | |
| 4,183,610 A | 1/1980 | Key | |
| 4,633,035 A * | 12/1986 | McMonagle | 174/257 |
| 4,641,910 A | 2/1987 | Rozmus | |
| 4,698,026 A | 10/1987 | Rolf | |
| 4,774,763 A | 10/1988 | Palecek et al. | |
| 4,775,326 A | 10/1988 | Lenaerts et al. | |
| 4,793,817 A | 12/1988 | Hiesbock | |
| 4,904,212 A | 2/1990 | Durbin et al. | |
| 4,952,172 A | 8/1990 | Barkus et al. | |
| 4,954,103 A | 9/1990 | Liebich et al. | |
| 5,564,954 A * | 10/1996 | Wurster | 439/751 |
| 5,569,390 A * | 10/1996 | Endo | 250/208.1 |
| 5,573,431 A * | 11/1996 | Wurster | 439/751 |
| 5,837,155 A * | 11/1998 | Inagaki et al. | 216/18 |
| 6,031,723 A * | 2/2000 | Wieloch | 361/719 |

FOREIGN PATENT DOCUMENTS

| | | |
|---|---|---|
| JP | 60-101998 | 6/1985 |
| JP | 61-082372 U | 5/1986 |
| JP | A-62-139384 | 6/1987 |
| JP | 3-250568 | 11/1991 |
| JP | 3-254181 | 11/1991 |
| JP | 06-028174 | 2/1994 |
| JP | 6-44038 | 6/1994 |
| JP | 7-192799 | 7/1995 |
| JP | 08-309920 | 11/1996 |
| JP | A 8-309920 | 11/1996 |
| JP | 9-23055 | 1/1997 |
| JP | 9-252182 | 9/1997 |
| JP | 10-208798 | 8/1998 |
| JP | A-10-208798 | 8/1998 |
| JP | 2000-323848 | 11/2000 |
| JP | A-2000-323848 | 11/2000 |

OTHER PUBLICATIONS

Patent Abstract of Japan, Publication No. 08-309920, Published on Nov. 26, 1996, in the name of Takahashi, et al.

Patent Abstract of Japan, Publication No. 10-208798, Published on Aug. 7, 1998, in the name of Hori, et al.

Patent Abstract of Japan, Publication No. 2000-323848, Published on Nov. 24, 2000, in the name of Wakabayashi, et al.

Patent Abstracts of Japan for Japanese Publication No. 03-254181, published Nov. 13, 1991 in the name of Kida Akinari, et al.

Patent Abstracts of Japan for Japanese Publication No. 09-023055, published Jan. 21, 1997 in the name of Amano Akira, et al.

Patent Abstracts of Japan for Japanese Publication No. 09-252182, published Sep. 22, 1997 in the name of Seki Yasuaki.

Office action for corresponding Japanese Patent Application 2002-287552 dated Oct. 16, 2007 including a partial translation.

Office action for corresponding Japanese Patent Application 2002-287568 dated Jul. 6, 2007 including a partial translation.

Japan Office action dated Mar. 5, 2008, for priority JP 2002-287552, with English translation indicating relevance of the reference in this IDS. U.S. Patent 5,564,954 was cited in the U.S. Office action dated Feb. 23, 2007, and Japan references 61-82372 and 09-23055 were listed in the IDS filed Dec. 14, 2007.

Patent Abstracts of Japan, Publication No. 07-192799, dated Jul. 28, 1995, in the name of William F. Foley et al.

* cited by examiner

Fig. 2A
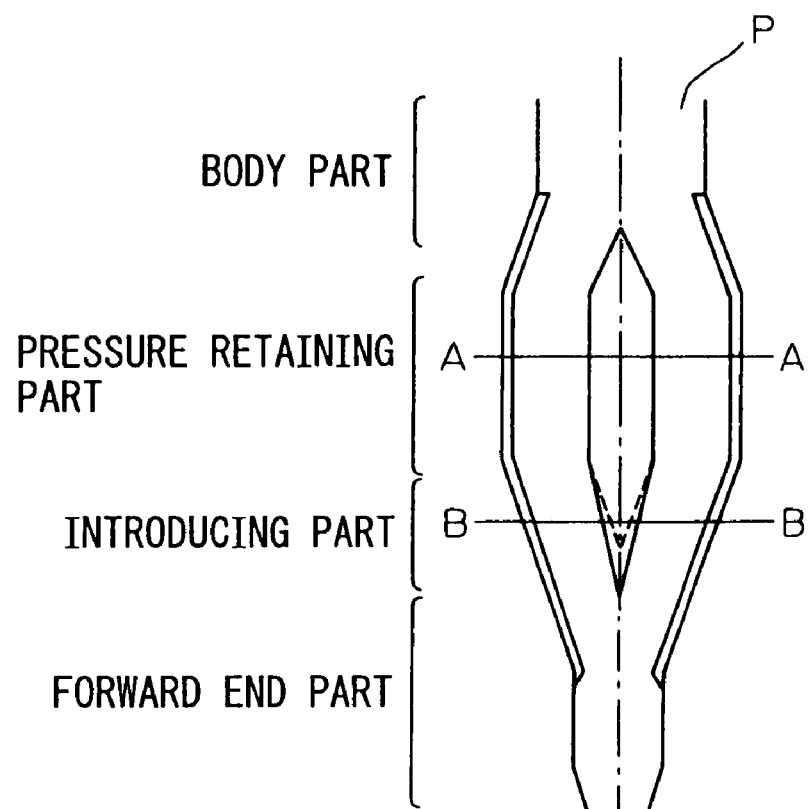
- BODY PART
- PRESSURE RETAINING PART
- INTRODUCING PART
- FORWARD END PART
Fig. 2B
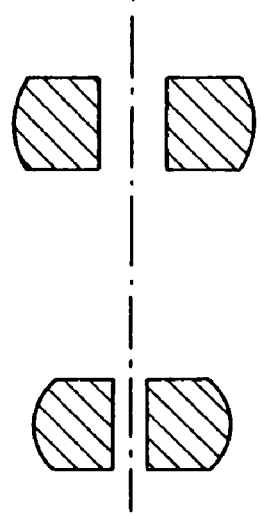
Fig. 2C Fig. 3A
BODY PART
PRESSURE RETAINING PART
INTRODUCING PART
FORWARD END PART
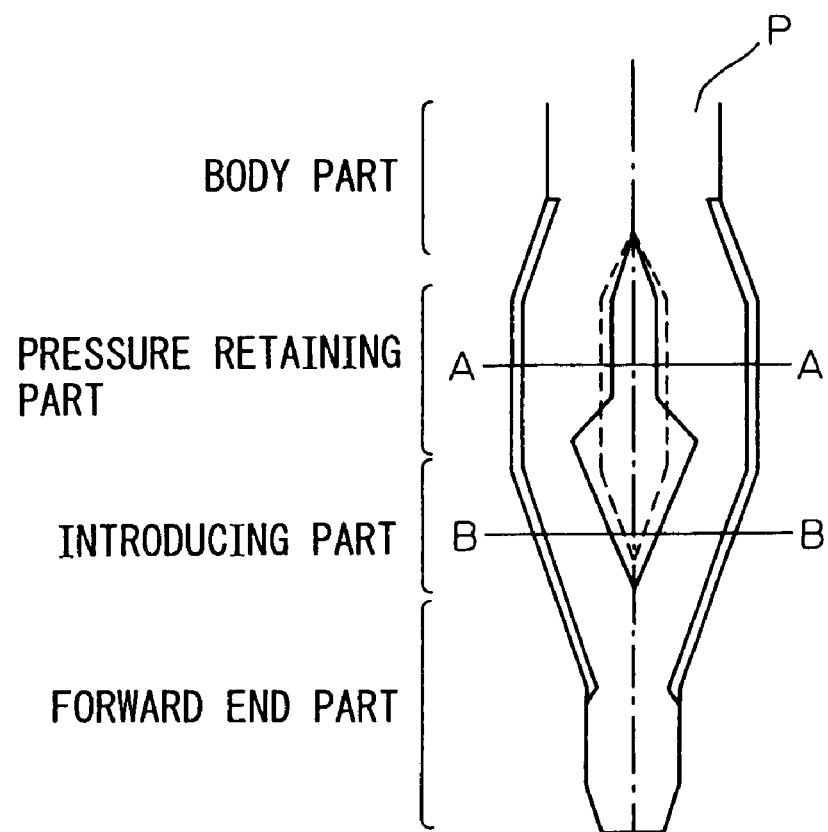
Fig. 3B
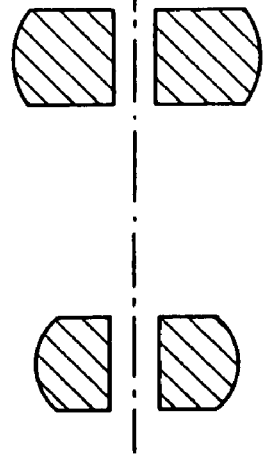
Fig. 3C Fig. 8A PRIOR ART
Fig. 8B PRIOR ART
Fig. 8C PRIOR ART
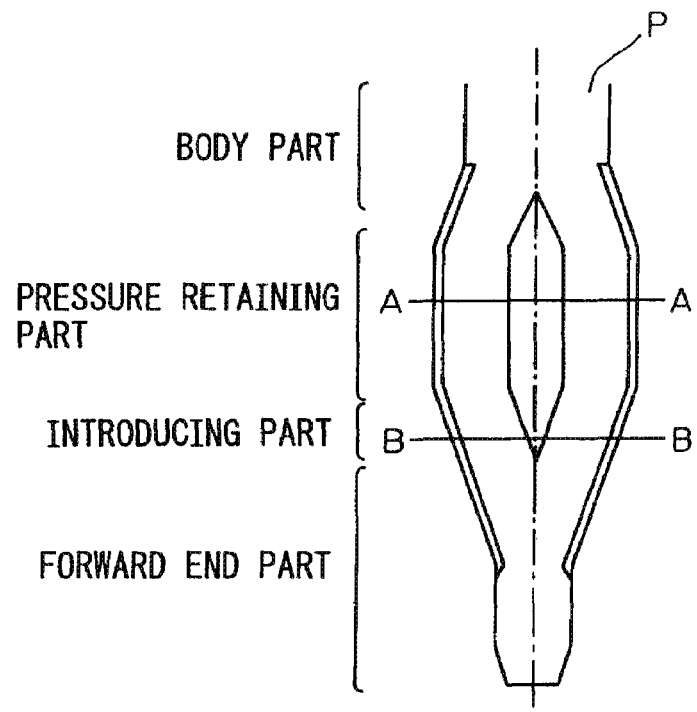
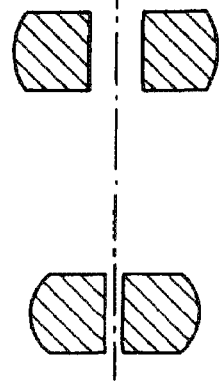
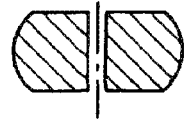

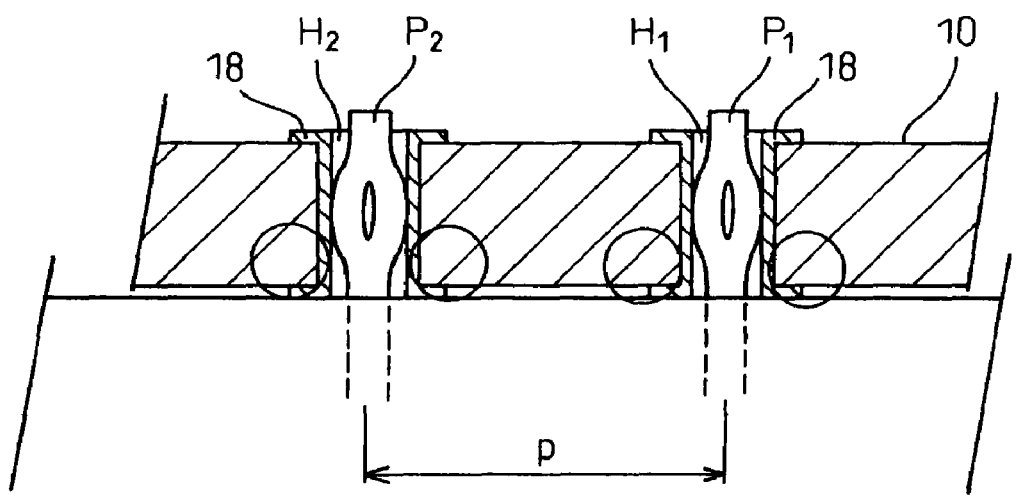

ELECTRONIC EQUIPMENT PROVIDED WITH WIRING BOARD INTO WHICH PRESS-FIT TERMINALS ARE PRESS-FITTED

CROSS-REFERENCE TO RELATED APPLICATION

This application claims priority of Japanese Patent Application Number 2002-287552, filed on Sep. 30, 2002, and Japanese Patent Application Number 2002-287568, filed on Sep. 30, 2002.

BACKGROUND OF THE INVENTION

1. Field of the Invention

The present invention relates to a press-fit terminal used for electronic equipment and a press-fit joining wiring board into which the press-fit terminal is press-fitted. More particularly, the present invention relates to a press-fit terminal and a press-fit joining wiring board characterized in that an influence on the wiring board, due to press-fitting, can be suppressed in the case where the press-fit terminal is press-fitted into a through-hole formed on the wiring board, which is arranged in an electronic control unit used in a high temperature environment, and the press-fit terminal is electrically joined to the through-hole.

2. Description of the Related Art

Conventionally, there are provided electric control units (ECU) for controlling devices such as an engine and the like which are mounted on a vehicle. Concerning on ECU, various control functions for controlling the devices are collected into one unit, and a plurality of ECU are mounted on the vehicle. Each ECU includes: a control circuit portion including a microcomputer which operates according to electronic information detected by each sensor, the control circuit portion conducting logical control; and a power circuit unit for controlling electric power supplied to an actuator which drives an object to be controlled according to the result of the calculation. The above ECU, to be mounted on a vehicle, is disclosed, for example, in the official gazette of JP-A-2000-323848.

In this conventional ECU to be mounted on a vehicle, the control circuit unit is formed into a control board, and the power circuit unit is built in a module. In the process of assembling ECU to be mounted on a vehicle, in the case of incorporating the control board into ECU, connection terminals, which are vertically arranged on the module in which the power circuit is built, are inserted into through-holes formed on the control board. After that, the connection terminals are soldered to conductive members formed in the through-holes by means of soldering. By this method, the connection terminals are electrically connected to a wiring pattern formed on the control board. At the same time, the control board is fixed in a resin case. However, as the above constitution is adopted, the assembling work is complicated.

Therefore, in order to positively assemble the control board and the connection terminal, and at the same time, in order to reduce the amount of time necessary for assembling and, further, in order to prevent the working environment from deteriorating, a board connection is proposed in which press-fit terminals are used for the connection terminals. A case in which the press-fit terminals are used for the board connection of an ECU is disclosed, for example, in the official gazette of JP-A-10-208798.

In order to conduct the board connection easily, a plurality of through-holes are formed at predetermined intervals on the control board incorporated into ECU. An inner circumferential face of each through-hole is plated with conductive material. On the other hand, the press-fit terminals are vertically arranged at predetermined intervals corresponding to the through-holes while one end part of each press-fit terminal is being embedded in the housing. For example, the needle-eye type press-fit terminals are used for these press-fit terminals. These press-fit terminals are press-fitted into the through-holes provided on the control board and connected to the board by means of press-fit joining.

Other than the press-fit terminals described above, for example, as disclosed in the official gazette of JP-B-6-28174 and others, press-fit terminals are proposed, the quantities of elastic deformation of which are uniform when the press-fit terminals are press-fitted into the through-holes. But, when these press-fit terminals are press-fitted into the through-hole, a portion of high rigidity formed in an upper portion of the press-fit terminal is located outside the through-hole.

On the other hand, concerning the control board mounted on the above electronic control unit, there is a demand for using a material, the coefficient of thermal expansion of which is low, from the viewpoint of enhancing the reliability of connection. In order to meet the demand, ceramic boards, ceramic-resin compound boards, fiber compound boards and the like have been developed. However, no boards exist which satisfy both the demands of reducing the coefficient of thermal expansion and enhancing the machining property. Therefore, laminated plates covered with metallic foil, in which a prepreg layer obtained when epoxy resin is impregnated in a sheet-like base material and dried and a sheet of metallic foil put on the surface are integrated into one body being formed with heat and pressure, are used as boards.

Therefore, for example, as disclosed in the official gazette of JP-A-8-309920, laminated boards have been proposed in which the elastic modulus of a resin is lowered by adding a flexible material to epoxy resin, so as to lower the elastic modulus of the resin, and thermal expansion in the surface direction of the laminated plate is suppressed. In the case of this laminated board, in order to prevent the metallic foil from peeling off from the laminated board by the thermal expansion of the board, fine particles having rubber-elasticity are contained in the resin, so that stress generated in the resin by thermal expansion can be absorbed and reduced. Due to the foregoing, thermal expansion in the plane direction of the laminated board can be reduced.

In this connection, in the case of press-fitting the press-fit terminals into the through-holes provided on the control board, minute damage may be caused in an opening portion of each through-hole formed on the control board by stress concentration in the case of press-fitting the press-fit terminal. Usually, the control board is composed of a laminated board made in such a manner that a large number of sheets in which glass fibers are combined with each other in the longitudinal and the lateral direction and impregnated in epoxy resin and compressed and solidified. Therefore, when the press-fit terminals are press-fitted, the opening portion of the through-hole is given a strong force in the face direction of the board. Accordingly, in the periphery of the opening portion of the through-hole, the laminated sheets are peeled off, that is, the base material is damaged.

In the case of an electronic control unit arranged in an engine compartment of an automobile which is operated in a severe operation environment, for example, in an environment in which the surrounding temperature is high and the humidity is also high, moisture tends to be absorbed in the damaged portion on the control board. As a result, copper ions are dissolved out from the conductive material, and the deterioration of insulation of the board proceeds. Recently, as various control functions are required for the electronic control unit, the density of the control board has increased and, further, the size of the control board has been reduced, the number of electric connecting portions on the control board has increased and the distance between the through-holes has decreased. Accordingly, the deterioration of insulation of the board is facilitated, which causes a serious problem.

Especially, in the case of the control board of the electronic control unit arranged in an engine compartment in which intense vibration occurs, in order to endure the intense vibration, it is necessary to increase the holding force of the press-fit terminals. However, when a press-fitting margin is increased so as to enhance the holding force of the press-fit terminals, a heavy load is given to the board in the case of press-fitting, which results in damage. On the contrary, in order to decrease a load given to the board in the case of press-fitting, it is possible to reduce the press-fitting margin. However, this method is disadvantageous in that the holding force of the press-fit terminals is decreased.

Therefore, it is an object of the present invention to provide a press-fit terminal characterized in that: the press-fit terminal can be applied to a commonly used control board; it is possible to reduce a load given to an opening portion of the through-hole of the control board in the case of press-fitting; a high intensity of the holding force can be maintained after the completion of press-fitting; and the reliability of the press-fit terminal is higher than that of a conventional press-fit terminal.

It is another object of the present invention to provide a press-fit joining wiring board capable of absorbing stress given from the outside so as to reduce a load generated on the board in the case where the press-fit terminal is press-fitted into a through-hole, which is arranged on a wiring board in an electronic control unit used in an environment of high temperature, so that the press-fit terminal can be electrically connected to the through-hole. It is still another object of the present invention to provide a board structure in which a conventional press-fit terminal can be used as it is and stress given to the board from the terminal can be absorbed by the board.

SUMMARY OF THE INVENTION

In order to solve the above problems, the present invention provides a press-fit terminal press-fitted into and held by a through-hole provided on a wiring board, comprising: a pressure retaining part; and an introducing part, wherein the pressure retaining part generates an elastic force which becomes a holding force when the pressure retaining part is press-fitted into the through-hole, and the introducing part generates an elastic force, the intensity of which is lower than that of the elastic force generated by the pressure retaining part.

The present invention also provides an electronic equipment comprising: a wiring board having a through-hole; and a press-fit terminal press-fitted into and held by the through-hole, wherein the press-fit terminal includes a pressure retaining part and an introducing part, the pressure retaining part generates an elastic force which becomes a holding force when the pressure retaining part is press-fitted into the through-hole, and the introducing part generates an elastic force, the intensity of which is lower than that of the elastic force generated by the pressure retaining part.

The introducing part is formed so that a diameter of the introducing part is gradually reduced when it comes to an end part. Further, the press-fit terminal has an aperture extending in the axial direction of the terminal, and an elastic force is generated in the pressure retaining part and the introducing part when the press-fit terminal is press-fitted.

A cross-sectional area of the introducing part is smaller than that of the pressure retaining part. Further, when an aperture of the introducing part is formed being extended in the axial direction toward the end part, the cross-sectional area of the introducing part is adjusted.

A region of the aperture corresponding to the press-fitting retaining part is formed small, and a region of the aperture corresponding to the introducing part is formed large. The region of the aperture corresponding to the press-fitting retaining part is formed small so that a reduction in the elastic force of the press-fitting part, which is caused when the cross-sectional area of the introducing part is decreased, can be made up.

The wiring board is composed of a laminated board, and the wiring board is composed of a laminated board on which a plurality of glass fiber sheets are multiply laminated and printed wiring is provided on the surface.

The present invention provides a press-fit joining wiring board made of a sheet-like base material, having a through-hole into which a press-fit terminal is press-fitted so that it can be held, wherein an elastic material is contained in the resin for combining the sheet-like base material.

The present invention provides an electronic equipment comprising a wiring board made of a sheet-like base material, having a through-hole into which a press-fit terminal is press-fitted so that it can be held, wherein an elastic material is contained in the resin for combining the sheet-like base material.

The elastic material contained in the press-fit joining wiring board is made of elastic flexible particulates dispersed in the resin of the board. The elastic flexible particulates are made of one of acrylic rubber, silicon rubber and nitrile butadiene rubber or the elastic particulates are made of a combination in which a plurality of the rubber materials are combined with each other.

The elastic material is filled in a surface layer portion of the board.

An inner circumferential face of the through-hole on the wiring board is made of metal, the hardness of which is higher than that of copper.

BRIEF DESCRIPTION OF THE DRAWINGS

Referring to the accompanying drawings, the present invention will be explained below.

FIGS. 2A to 2C are views for explaining an embodiment of a press-fit terminal of the present invention.

FIGS. 3A to 3C are views for explaining another embodiment of a press-fit terminal of the present invention.

FIGS. 8A to 8c are views for explaining a profile of a conventional press-fit terminal.

FIG. 9 is a view for explaining a state in which press-fit terminals are press-fitted into through-holes on a wiring board.

DETAILED DESCRIPTION OF THE INVENTION

In order to clarify the effects provided by the present invention, first, specific explanations will be made into a common press-fit terminal and press-fit joining wiring board used for electronic equipment to which the present invention is not applied.

Figure 6:
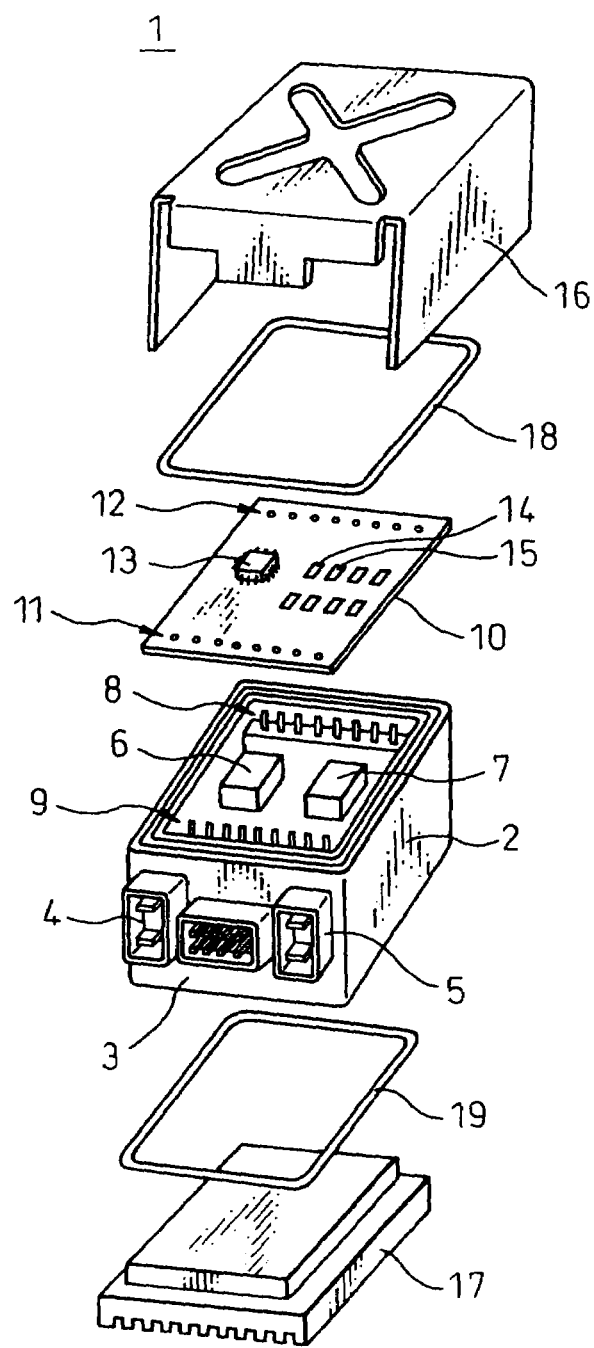
FIG. 6 is an exploded perspective view for explaining a state in which electronic parts are incorporated into a conventional electronic control unit to be mounted on a vehicle.

Therefore, an outline of assembling an electronic control unit of the prior art is shown in FIG. 6. A primary portion of the electronic control unit 1 is accommodated in the integrated connector resin case 2 in which the connector case is integrally formed. The connector 3 for controlling and the connectors 4, 5 for supplying electric power are provided being collected onto one side of the integrated connector resin case 2. Due to the above structure, an electrical connection of the electronic control unit 1 to the outside can be accomplished in only one direction.

In the integrated connector resin case 2, a control circuit unit and an electric power circuit unit are accommodated. The electric power circuit unit includes a plurality of power electronic parts 6, 7. The terminals 8, 9 for connection are attached to a module unit on which these power electronic parts are mounted. The terminals 8, 9 for connection are used for an electric connection with the control board 10 included in the control circuit unit. In this case, the control board 10 is attached to an upper face side of the integrated connector resin case 2. At the end of the board 10 concerned, a plurality of through-holes 11, 12 are provided. The terminals 8, 9 for connection are inserted into the through-holes 11, 12, and the control circuit and the power circuit are electrically connected with each other by means of soldering. A plurality of electronic parts 13, 14, 15 for control are mounted on the control board 10. After the control board 10 has been attached to an upper side of the integrated connector resin case 2, the cover 16 is set on the control board 10. On the other hand, on a bottom face side of the integrated connector resin case 2, there is provided a heat sink 17 for removing the heat generated by the power electronic parts 6, 7 of the power circuit. In the joining portion between the cover 16 and the integrated connector resin case 2 and also in the joining portion between the heat sink 17 and the integrated connector resin case 2, the packing members 18, 19, for water-proofing, are interposed.

As described above, in the conventional electronic control unit to be mounted on a vehicle, in the middle of assembling the electronic control unit, the terminals 8, 9 for connection, which are vertically arranged on the module into which the power circuit is incorporated, are inserted into the through-holes 11, 12 provided on the control board 10, and then the terminals 8, 9 for connection are soldered to the conductive material provided in the through-holes 11, 12 by means of plating. Due to the foregoing, the terminals 8, 9 for connection are electrically connected to the wiring pattern formed on the control board 10, and at the same time the control board 10 is fixed to the integrated connector resin case 2.

However, in order to conduct a connection by means of soldering, not only soldering work but also the cleaning work must be conducted. Therefore, much labor is required and, further, the working environment is deteriorated. Furthermore, when the solder material is changed from the conventional eutectic solder to lead-free solder, various technical problems are caused when the connector terminals are soldered, and much labor is required for managing the soldering work.

In this case, in order to positively conduct a connection of the terminals for connection with the control board, in the aforementioned conventional electronic control unit, after the terminals for connection have been inserted into the through-holes formed on the control board, soldering is performed. Therefore, the following problems are encountered. When soldering is conducted on the through-holes, the holes opposite to the side on which the terminals for connection are inserted are closed by solder. Therefore, it is difficult to confirm whether or not the through-holes and the terminals for connection are contacted with each other, and it is difficult to find a defective connection. Further, as the terminals for connection and the control board are fixed to each other, for example, vibration of the housing to which an actuator is attached is directly transmitted to the control board, and the electronic parts mounted on the control board are badly affected.

Figure 7A:
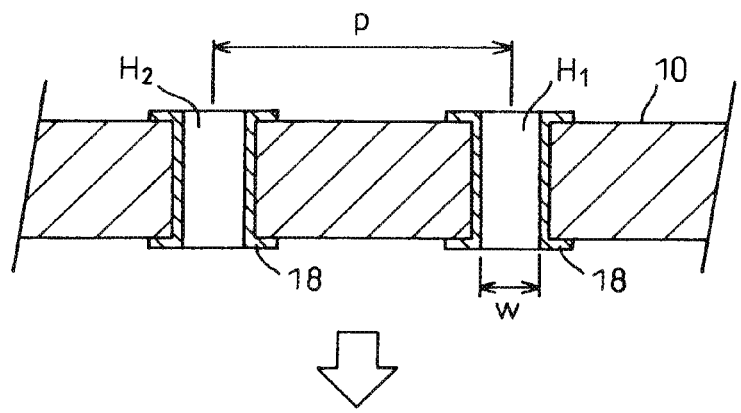
FIGS. 7A and 7B are views for explaining a constitution in which press-fit terminals are press-fitted into through-holes on a wiring board on which electronic parts are mounted.
Figure 7B:
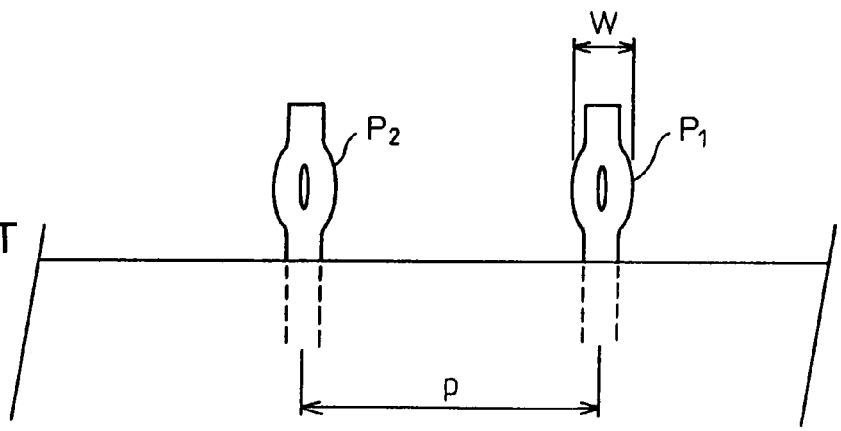

In order to realize a board connection in which the control board and the terminals for connection are positively connected to each other, working time can be reduced and, further, the working environment is not deteriorated, the press-fit terminals are used for the terminals for connection. FIGS. 7A and 7B are views showing a state of the connection of the control board with the terminals in the electronic control unit in the case where this board connection is applied to the electronic control unit.

FIG. 7A is a longitudinal sectional view of the control board at the through-hole portion. The control board 10 shown in FIG. 7A is the same as the control board used for the electronic control unit 1 shown in FIG. 6. FIG. 7A illustrates a portion relating to the through-holes 11, 12 on the control board 10. In FIG. 7A, these through-holes are represented by reference marks $H_1$ and $H_2$. Actually, there are provided more through-holes. However, in this case, two typical through-holes are shown. The through-holes are arranged at regular interval p. From the walls on the inner circumferential faces of through-holes $H_1$ and $H_2$ to the peripheries of the openings of the through-holes on the surface of the control board 10, there are provided conductive members 18 made by means of soldering. In this case, the through-hole diameter is represented by reference mark w.

On the other hand, in FIG. 7B, there are shown press-fit terminals $P_1$ and $P_2$ which are vertically embedded in the terminal housing for connection. The number of these vertically arranged press-fit terminals is the same as the number of the through-holes provided on the control board 10. However, in FIG. 7B, two press-fit terminals $P_1$ and $P_2$ are shown corresponding to through-holes $H_1$ and $H_2$ illustrated in FIG. 7A. Two press-fit terminals $P_1$ and $P_2$ are vertically arranged at positions which are distant from each other by interval p of the through-holes. The length of each press-fit terminal $P_1$ and $P_2$ is adjusted so that the control panel 10 can be fixed at a predetermined position in the case 10. The maximum width of the press-fit terminal before press-fitting is represented by reference mark W.

In this case, FIG. 8A is a side view showing a needle-eye type press-fit terminal in detail. The direction of the press-fit terminal shown in FIG. 8A is opposite to the direction of the press-fit terminal shown in FIG. 7A. Accordingly, the press-fit terminal shown in FIG. 8A is press-fitted into the through-hole provided on the control board from an upper portion.

The press-fit terminal is formed by punching a metallic plate made of conductive material such as copper alloy. Therefore, the press-fit terminal is one piece of terminal. In the press-fit terminal, the body part, pressure retaining part, introducing part and forward end part are integrally formed in the axial direction. The pressure retaining part and the introducing part respectively form a spring unit which functions as a spring in the case of press-fitting. In the example shown in FIG. 7B, the body part is embedded in the terminal housing for connection, that is, the body portion becomes a base end part used for vertically arranging the press-fit terminal. Concerning the introducing part, a forward end part of the introducing part is formed thin so that the press-fit terminal can be easily inserted into the through-hole.

An aperture, which penetrates a metallic plate, is formed at the axial center of the press-fit terminal in the longitudinal direction simultaneously when the metallic plate is punched. The pressure retaining part and the introducing part are formed by this aperture. Width W of the pressure retaining part at the position indicated by line A-A is the largest in the terminal, and the width of the introducing part is gradually reduced when it comes to the forward end part.

FIG. 8B is a view showing a cross section taken on line A-A which is a portion of the pressure retaining part, and FIG. 8C is a view showing a cross section taken on line B-B which is a portion of the introducing part. The cross-sectional area (not including the aperture) of the pressure retaining part and that (not including the aperture) of the introducing part epual to each other.

When the press-fit terminal shown in FIG. 8A is press-fitted into the through-hole, the press-fit terminal comes down from an upper portion or alternatively the control board comes up from a lower portion. Due to the foregoing, a portion of the introducing part close to line B-B is first contacted with the periphery of the opening of the through-hole and given a load and elastically deformed. When the load is successively given, the pressure retaining part is press-fitted into the through-hole. In this case, a press-fitting margin of the press-fit terminal with respect to the through-hole is (W-w).

FIG. 9 is a view showing a state in which press-fit terminals $P_1$, $P_2$ shown in FIG. 7B are press-fitted into through-holes $H_1$, $H_2$ formed on the control board 10 shown in FIG. 7A. As shown in FIG. 9, all the pressure retaining part of the press-fit terminal shown in FIG. 8A is press-fitted into the through-hole, and the control board 10 is held at a position close to the terminal module for connection, and the control board 10 is fixed. Further, the pressure retaining part tightly comes into contact with the conductive material 18 provided in through-holes $H_1$, $H_2$, so that the press-fit terminal can be electrically connected to the conductive material 18.

However, when the press-fit terminal is press-fitted into the through-hole formed on the control board, minute damage tends to be caused by stress concentration, which occurs in the process of press-fitting, at the opening portion of the through-hole on the control board. The joining method of press-fitting conducted by the press-fit terminal is frequently used in the common electronic equipment. In this case, the diameter tolerance of the through-hole is controlled while importance is being attached to it, and the terminal is press-fitted in the through-hole. However, even in this case, a holding force to hold the terminal by the board is obtained by press-fitting the terminal into the board. Therefore, the board is given an unnecessary load. Accordingly, in the case of press-fitting the press-fit terminal, a strong force is given to the opening portion of the through-hole in the direction of the board face. As a result, the laminated sheet in the periphery of the opening portion of the through-hole is peeled off, that is, damage is caused on the board.

As explained above, in the conventional method of press-fit joining used for electronic equipment, when the press-fit terminal is press-fitted into the through-hole formed on the wiring board, the wiring board itself is given an unnecessary load.

In order to solve the above problems caused in the prior art, in the present invention, a profile of the press-fit terminal used for press-fit joining is devised, that is, the present invention provides a press-fit terminal characterized in that: the press-fit terminal can be applied to a commonly used wiring board; a load given to the wiring board in the case of press-fitting the terminal is suppressed; an intensity of the holding force can be maintained after the completion of press-fitting; and the reliability is higher than that of the conventional press-fit terminal.

Next, referring to the drawings, an embodiment of the press-fit terminal of the present invention will be explained below.

Figure 1A:
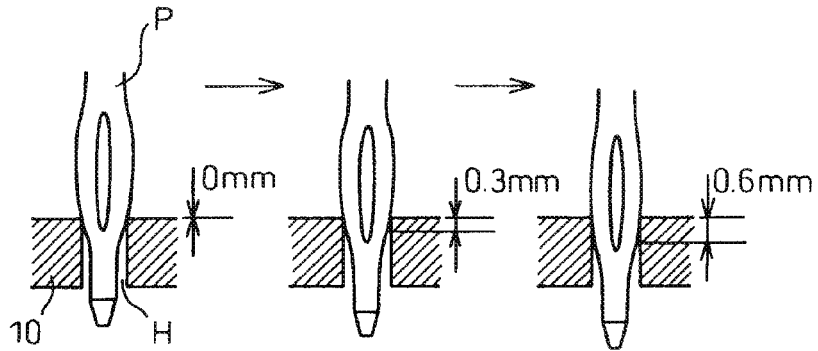
FIGS. 1A to 1C are views for explaining a state of stress generated on a board in the case of press-fitting a press-fit terminal into a through-hole.
Figure 1B:
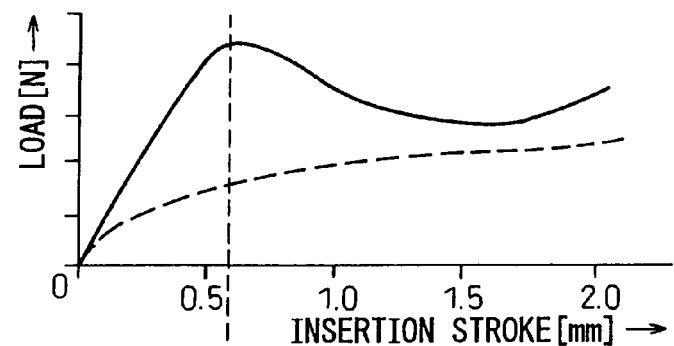
Figure 1C:
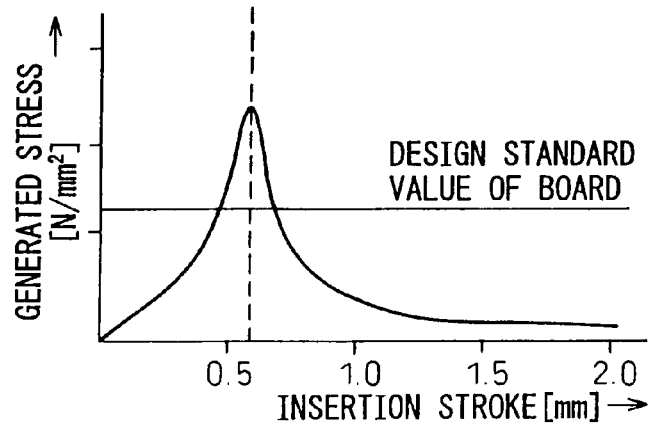

First of all, before the embodiment of the press-fit terminal of the present invention is explained, the concept of this press-fit terminal is shown in FIGS. 1A to 1C. FIG. 1A is a view showing a state in which press-fit terminal P of the prior art shown in FIG. 8A is press-fitted into through-hole $H_{1\ or\ H2}$ on the control board shown in FIG. 7A. In FIG. 1A, in order to simplify the drawing, an outline of the profile of press-fit terminal P is illustrated, and the conductive member 18 provided in through-hole $H_1$ or $H_2$ is omitted.

FIG. 1A is a view showing a state in which press-fit terminal P is press-fitted into through-hole H. When press-fit terminal P is inserted into through-hole H and the introducing part comes into contact with the peripheral portion of the opening of through-hole H, the insertion stroke is set at 0 mm. When press-fit terminal P is given a force and the introducing part is inserted and the pressure retaining part starts being press-fitted into through-hole H, the insertion stroke is set at 0.6 mm. Although not shown in the drawing, the press-fitting motion successively proceeds after that, and the insertion stroke is further increased. In this press-fitting motion, the terminal is given a constant pressing force.

FIG. 1B is a graph showing a change in the load given to the control board 10 when press-fit terminal P is press-fitted into through-hole H as illustrated in FIG. 1A. The axis of abscissa shows an insertion stroke (mm), and the axis of ordinate shows a load (N). On the graph shown in FIG. 1B, the load curve shown by a solid line represents a change in the load given in the process of press-fitting motion of press-fit terminal P illustrated in FIG. 1A. It can be understood that the load peaks when the insertion stroke is approximately 0.6 mm.

FIG. 1C is a graph showing a stress curve on which a change in the stress generated in the peripheral portion of the opening of through-hole H on the board is shown. The axis of abscissa shows an insertion stroke (mm), and the axis of ordinate shows a generated stress ($N/mm^2$). As can be understood from this stress curve, an intensity of the generated stress becomes maximum when the insertion stroke is 0.6 mm and gradually decreases when the press-fitting motion proceeds. In this case, the generated stress is compared with the design standard value of the board as follows. As shown in FIG. 1C, the maximum value at the insertion stroke 0.6 mm exceeds the design standard value of the board. Therefore, an excessively high intensity of stress is generated in the periphery of the opening of the through-hole provided on the board.

It can be estimated that the laminated structure of the peripheral portion is damaged by this, excessively high intensity of stress.

In order to prevent the occurrence of damage of the peripheral portion of the opening of through-hole H when press-fit terminal P is press-fitted into through-hole H, it is necessary to determine the maximum value of this stress curve so that the maximum value cannot exceed the design standard value of the board. In order to accomplish this object, the profile of the press-fit terminal should be determined so that a change in the load relating to the insertion stroke can become the stress curve shown by the broken line with respect to the stress curve of the solid line having the maximum value of the generated stress as shown in FIG. 1B.

According to the above knowledge, the profile of the press-fit terminal of this embodiment is determined so that the press-fit terminal can be provided with a two-step elastic characteristic in which an intensity of the stress given to the board by the introducing part in the process of press-fitting is reduced and an intensity of the holding force is maintained or increased by the pressure retaining part. Referring to FIGS. 2 and 3, the press-fit terminal of the embodiment will be explained in detail as follows.

FIG. 2A is side view of the press-fit terminal in which an elastic force of the pressure retaining part in the case of press-fitting is the same as that of the needle-eye type press-fit terminal P shown in FIG. 8A and an elastic force of the introducing part is lower than the elastic force of the pressure retaining part. In the same manner as that of the press-fit terminal shown in FIG. 8A, the press-fit terminal shown in FIG. 2A is formed into an integrated body by punching a metallic plate. The thickness of press-fit terminal P is uniform.

In the same manner as that of the press-fit terminal shown in FIG. 8A, the press-fit terminal shown in FIG. 2A includes a body part, a pressure retaining part, an introducing part and a forward end part, which are formed by means of punching, and a penetrating aperture is formed at the center in the axial direction. A cross-sectional area of the pressure retaining part taken on line A-A is shown in FIG. 2B. The cross-sectional area of the pressure retaining part is the same as that of the pressure retaining part of the press-fit terminal shown in FIG. 8A, which is the same as the cross-sectional area shown in FIG. 8B.

In the case of press-fit terminal P shown in FIG. 2A, in order to make an intensity of the elastic force of the introducing part lower than an intensity of the elastic force of the pressure retaining part, the length of the aperture, which is long in the axial direction, is extended toward the forward end part compared with the length of the aperture provided in the conventional terminal shown by the broken line. When the aperture is composed as described above, compared with the conventional press-fit terminal shown in FIG. 8A in which the cross-sectional area (not including the aperture) of the pressure retaining part is the same as that (not including the aperture) of the introducing part, in the case of the press-fit terminal of this embodiment shown in FIG. 2A, as shown in FIG. 2C, the cross-sectional area (not including the aperture) of the introducing part taken on line B-B is smaller than the cross-sectional area (not including the aperture) of the pressure retaining part.

Figure 4:
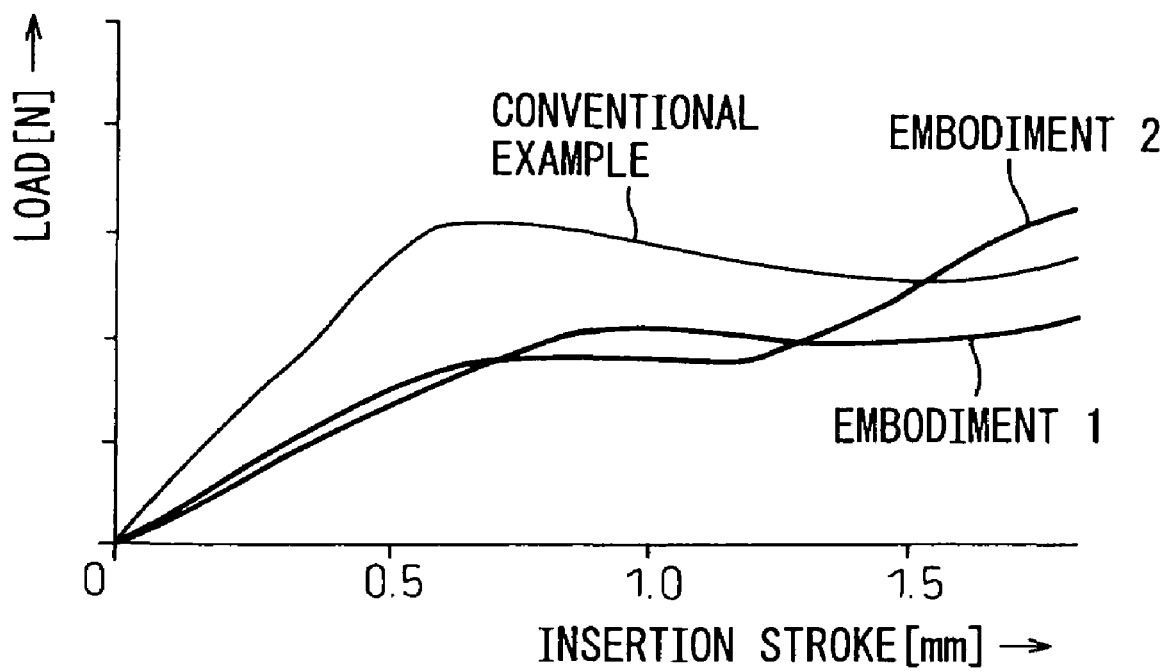
FIG. 4 is a graph showing a comparison between a conventional case and an embodiment of the invention, wherein a change in the inserting load with respect to the inserting stroke of the press-fit terminal of the conventional case and a change in the inserting load with respect to the inserting stroke of the press-fit terminal of the embodiment of the invention are compared with each other.

According to the press-fit terminal of this embodiment shown in FIG. 2A, when the cross-sectional area (not including the aperture) of the introducing part is reduced to smaller than the cross-sectional area (not including the aperture) of the pressure retaining part, an intensity of the elastic force of the introducing part is reduced. Therefore, the maximum value of stress shown on the generated stress curve in FIG. 1C can be reduced. The press-fit terminal of this embodiment is defined as Embodiment 1, and the load curve is shown in FIG. 4. Compared with the load curve of the conventional press-fit terminal, it is possible to reduce a generation of the load by the introducing part. Therefore, it is possible to suppress the occurrence of damage of the board in the case of press-fitting. Concerning the elastic force of the pressure retaining part, it is possible to ensure a necessary intensity of the holding force without changing the press-fit margin of the press-fit terminal of the prior art.

Next, referring to FIG. 3, another embodiment of the profile of the aperture for reducing an elastic force of the introducing part will be explained below. In the case of the press-fit terminal shown in FIG. 2A, the elastic force of the introducing part is reduced in such a manner that the press-fit margin is not changed from that of the prior art, and an intensity of the elastic force of the introducing part is reduced when the length of the aperture, which is long in the axial direction, is extended long toward the forward end part. However, in the embodiment shown in FIG. 3, the press-fit margin is not changed in the same manner as that of the embodiment described above, however, without changing the length of the aperture from the length of the aperture of the prior art, a profile of the aperture is devised so as to change an intensity of the elastic force of the introducing part.

An entire profile of press-fit terminal P used for another embodiment shown in FIG. 3A is the same as that of the needle-eye type press-fit terminal P shown in FIG. 8A. When a metallic plate is punched, an entire press-fit terminal P is formed into one body. The thickness of press-fit terminal P is uniform.

This press-fit terminal P includes a body part, a pressure retaining part, an introducing part and a forward end part, which are integrally formed by means of punching. At the center of the press-fit terminal, there is provided an aperture penetrating the axial direction. Length of the aperture is the same as that of the press-fit terminal shown in FIG. 8A. In this connection, in FIG. 3A, the aperture of the conventional press-fit terminal is shown by the broken line. A cross-sectional area of the pressure retaining part taken on line A-A is shown in FIG. 3B, and a cross-sectional area of the introducing part taken on line B-B is shown in FIG. 3C.

In the case of press-fit terminal P shown in FIG. 3A, in order to reduce an intensity of the elastic force of the introducing part to be lower than an intensity of the elastic force of the pressure retaining part of the conventional press-fit terminal, as shown in FIG. 3C, the width of the portion relating to the introducing part is reduced so that the cross-sectional area taken on line B-B corresponding to the part of the prior art can be reduced. However, when a predetermined elastic force is obtained by reducing the sectional area when the width of the introducing part is decreased, as shown by the profile of the aperture illustrated in FIG. 3A, the aperture must be extended to a portion of the region of the pressure retaining part. Then, it becomes difficult for the press-fit terminal to exhibit an initial holding force if the cross-sectional area of the pressure retaining part taken on line A-A is kept to be the same as that of the pressure retaining part of the conventional press-fit terminal.

In order to solve the above problems, in the case of press-fit terminal P of another embodiment shown in FIG. 3A, in order to make up this deterioration of the holding force, an opening area of the aperture relating to the pressure retaining part is reduced, and the cross-sectional area relating to line A-A is extended as compared with the cross-sectional area of the press-fit terminal of the prior art. These circumstances are shown in FIG. 3B.

As described above, according to the press-fit terminal of another embodiment shown in FIG. 3A, when the cross-sectional area of the introducing part is reduced smaller than the cross-sectional area of the pressure retaining part, an intensity of the elastic force of the introducing part can be reduced and the maximum value of stress on the generated stress curve shown in FIG. 1C can be decreased. A load curve relating to the press-fit terminal of another embodiment is shown in FIG. 4 as Embodiment 2. It can be understood that a load generated by the introducing part is decreased as compared with the load curve of the conventional press-fit terminal. Therefore, it is possible to suppress the occurrence of damage of the board in the case of press-fitting. When a cross-sectional area of the pressure retaining part is increased, a lowered elastic force of the pressure retaining part is made up. Therefore, an intensity of the holding force can be ensured without changing the press-fit margin of the conventional press-fit terminal.

In the case of the press-fit terminal explained above, the needle-eye type press-fit terminal is taken up as an example. In the case of the press-fit terminal of the Z type or the action type, it is possible to make the press-fit terminal have the two-step elastic characteristic, in which an intensity of the elastic of the introducing part is made to be lower than an intensity of the elastic force of the pressure retaining part, and it is also possible to reduce the occurrence of damage of the board caused in the case of press-fitting the terminal into the through-hole.

In the case of the press-fit terminal of the above embodiment, a profile of one opening formed at the center extending in the axial direction is changed so as to adjust the cross-sectional area of the introducing part and reduce an intensity of the elastic force of the introducing part. However, the aperture to generate the elastic force may be divided into the pressure retaining part and the introducing part. Further, two apertures relating to the introducing may be provided so as to reduce an intensity of the elastic force of the introducing part.

In the case of the press-fit terminal of the above embodiment, the press-fit terminal is made by being punched from a metallic plate. Therefore, the entire terminal is uniform in thickness. However, application of the method of making the press-fit terminal have the two-step elastic characteristic, in which an intensity of the elastic force of the introducing part is made lower than an intensity of the elastic force of the pressure retaining part, is not necessarily limited to the uniform thickness of the press-fit terminal. Because of the uniform thickness of the press-fit terminal, an intensity of the elastic force of the introducing part is changed by adjusting the profile of the aperture. It is possible to change the cross-sectional areas of the introducing part and the pressure retaining part by changing the thickness of the press-fit terminal. Examples of the above method of changing the cross-sectional areas of the introducing part and the pressure retaining part by changing the thickness of the press-fit terminal are press forming, plating and the like.

In the above explanations, the embodiment of the press-fit terminal of the present invention is shown, and when the constitution of the press-fit terminal is devised, the generation of stress on the press-fit joining wiring board is suppressed. Next, referring to the drawings, an embodiment of the press-fit joining wiring board of the present invention, in which an intensity of stress generated on the wiring board is relieved by devising the constitution of the press-fit joining wiring board itself, will be explained as follows.

On the press-fit joining wiring board of the present embodiment, in the case where the press-fit terminal is press-fitted into and electrically connected with the through-hole provided on the wiring board in electronic equipment, external stress caused in the process of press-fitting is absorbed so that a load generated on the board is suppressed. According to the press-fit joining wiring board of the present embodiment, the conventional press-fit terminal can be used as it is, and stress given to the board by the press-fit terminal can be absorbed by the board structure.

As described before, in the case of incorporating a control board into an electronic control device, when press-fit terminals are press-fitted into through-holes, minute damage is caused by stress concentration in the entrance portions of the through-holes on the control board. These circumstances are shown in FIG. 9. The aforementioned damage is caused in the peripheries of the opening portions $H_1$, $H_2$ of the through-holes on the control board surrounded by circles in the drawing.

In the case of electronic equipment commonly used, a method of joining by press-fit terminals is frequently used. In this case, press-fit terminals are press-fitted while diameter tolerance of the through-hole on the board is being controlled, priority being given to the diameter tolerance. However, since a holding force is obtained by press-fitting the terminals into the through-holes even in this case, the board is given an unnecessary load and damage is caused in the process of press-fitting.

Usually, the control board is composed of a laminated structure in which a large number of glass fiber sheets made of glass fibers combined with each other in the lateral and the longitudinal direction are put on each other and compressed and solidified. In the process of press-fitting, a strong force is given to the periphery of the opening portion. Therefore, the laminated sheets in the periphery of the through-hole are peeled off and damaged. Further, when elasticity of the press-fit terminal is increased by providing a large press-fit margin so as to strengthen the fixation of the press-fit terminals, the occurrence of damage caused by press-fitting becomes remarkable.

When an electronic control unit is operated in a severe operating environment like an electronic control unit arranged in an engine compartment of an automobile, for example, when the peripheral temperature is high and further the humidity is high and furthermore the vibration is intense, damage caused in the process of press-fitting affects the board characteristic. In the case where damage caused in the process of press-fitting is existing on the control board, moisture tends to be absorbed from the damaged portion when the board is placed in an environment of high temperature and high humidity. As a result, copper ions from the conductive material invade the board, which facilitate the deterioration of insulation of the board. Recently, the electronic control unit is required to have various control functions. Therefore, the density of components to be incorporated onto the control board is increased and further the size of the control board is decreased. Further, the number of electrical connections on the control board is increased and the distance between the through-holes is reduced, which facilitates the deterioration of insulation of the board.

In the case of a control board of an electronic control unit arranged in an engine room intensely vibrated, it is necessary to strengthen a holding force of a press-fit terminal. When a press-fit margin is extended so as to increase a holding force of the press-fit terminal, a load given to the control board is increased in the process of press-fitting. Even when the load given to the control board is reduced by decreasing the press-fit margin in order to suppress the load given to the control board in the process of press-fitting, an intensity of the holding force of the press-fit terminal is lowered.

In order to solve the above problems, the present invention provides a board structure in which, for example, when press-fit terminals are press-fitted into, and electrically joined to through-holes provided on a wiring board incorporated into an electronic control unit used in an environment of high temperature, the external stress is absorbed in the case of press-fitting so as to suppress a load given to the board and conventional press-fit terminals can be used as they are so that the stress given to the board from the terminals can be absorbed by the board.

Before the press-fit joining wiring board of this embodiment is explained, the concept of improving this press-fit joining wiring board is shown in FIGS. 1A to 1C. This concept of improving the press-fit joining wiring board is the same as that of improving the press-fit terminals of the present embodiment.

As shown by the load curve of the solid line in FIG. 1B, when press-fit terminal P is press-fitted into through-hole H, a change in the load given to the control board 10 peaks at a portion close to the insertion stroke 0.6 mm. FIG. 1C shows a change in the stress generated in the peripheral edge portion of through-hole H on the board. As can bee seen from the stress curve, an intensity of the generated stress peaks at a portion close to the insertion stroke 0.6 mm and decreases as the press-fitting motion proceeds.

The design standard value of the conventional board is shown as illustrated in FIG. 1B. In this case, when the load is compared with this design standard value of the conventional board, the maximum value of the load at a portion close to the insertion stroke 0.6 mm exceeds the design standard value of the conventional board. Therefore, an excessively high intensity of stress is generated in the peripheral edge portion of the through-hole provided on the board. Accordingly, it can be estimated that the laminated structure of the peripheral edge portion is damaged.

In order to prevent the peripheral edge portion of the opening of through-hole H from being damaged when press-fit terminal P is press-fitted into through-hole H, the maximum value of this stress curve must not exceed the design standard value of the board.

According to the above knowledge, the present invention provides the following board structure. In the case of a press-fit connecting wiring board of the present embodiment, when press-fit terminals are respectively press-fitted into a plurality of through-holes provided on a wiring board, an intensity of the external stress given to the board is reduced in the board structure. In order to reduce the intensity of the external stress given to the board, the specific means is to fill elastic material into the resin which combines sheet-like base materials of the board.

The press-fit connecting wiring board of the present embodiment will be explained as follows. As a method of filling resin material into the resin for combining the sheet-like base material of the board, for example, as a method of filling resin material into epoxy resin, various methods are provided.

For example, when a prepreg layer, which is obtained when sheet-like base material is impregnated in epoxy resin varnish containing a hardening agent and dried, and a sheet of metallic foil placed on the surface are heated and compressed into one body, fine particulates, which are not compatible to epoxy resin, having rubber elasticity are dispersed in a portion or all of the prepreg layer, and the epoxy resin varnish is impregnated in the sheet-like base material and dried so that the prepreg layer can be formed.

In this case, the dispersed fine particulates are not compatible to epoxy resin contained in varnish and has rubber elasticity. The particulates are made of one of acrylic rubber, silicon rubber and nitrile butadiene rubber or the elastic particulates are made of a combination of them.

Figure 5:
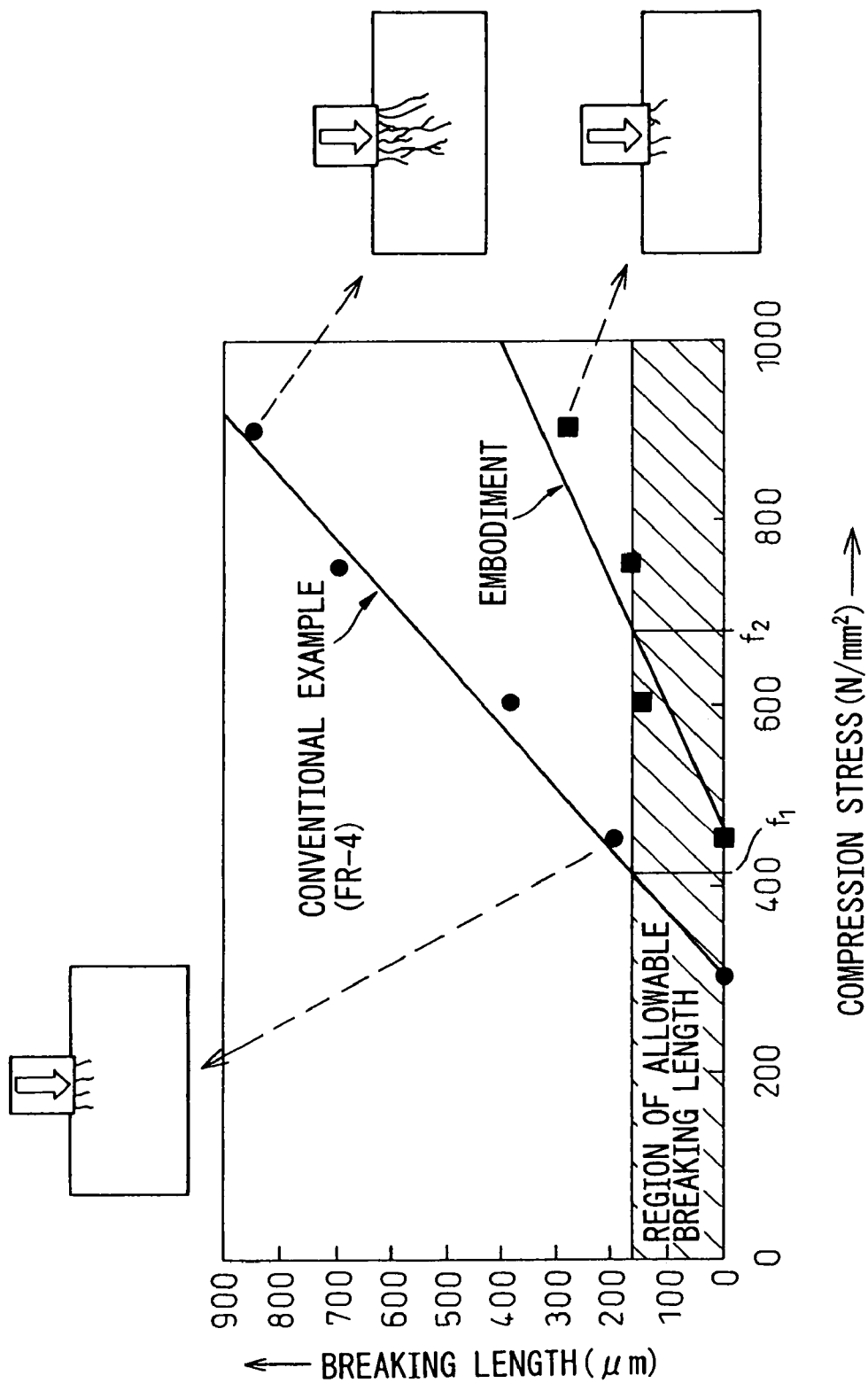
FIG. 5 is a graph showing a comparison between an embodiment of the invention and a conventional example, wherein a relation of compression stress to length of damage of the embodiment of the invention and a relation of compression stress to length of damage of the conventional example are compared with each other.

Next, concerning the wiring board on which the above fine particulates are dispersed in the resin and the resin composing the board is given elasticity, the circumstances of occurrence of damage on the board in the case of press-fitting the press-fit terminal are shown in FIG. 5 in the case of applying the wiring board to press-fit joining into the through-hole. In the graph of FIG. 5, the press-fit connecting wiring board of the present embodiment, on which elasticity is given to the resin, is shown as an embodiment. For a comparison, a conventionally used composite board (FR-4) made of epoxy resin, for example, a glass cloth resin board is shown as a conventional example.

In FIG. 5, as an example of damage which was caused on the board when the press-fit terminal was press-fitted into the through-hole provided on the board, a peel of the sheet-like base material was taken up, and the length of the damage portion was measured, and the result of measurement is shown. With respect to a board test piece, in which stress was assumed to be given to the wall face in the through-hole, a load was given in the direction parallel to the laminated face of the sheet-like base material of the board and the length of the damage portion was measured. In the graph of FIG. 5, black circular marks show the result of measurement in the conventional example, and black square marks show the result of measurement in the embodiment. The bold solid line corresponds to the embodiment, and the thin solid line corresponds to the conventional example. These lines express a tendency of the result of each measurement by plotting.

Concerning the conventional example, inspection is made into a tendency of the development of the length of a damaging portion as follows. In the conventional example, according to an increase in the intensity of stress given to the board, the length of a damaging portion increases. On the other hand, in the embodiment, even if the intensity of stress given to the board increases, the degree of development of the length of a damaging portion is suppressed. The reason why the above difference is caused is that the elastic material is filled in the resin. Even if the type of the particulates to be filled is changed, the result of the length of the damaging portion is almost the same as that the embodiment shown in FIG. 5.

In the case of the board used for the conventional example, importance is attached to the holding force between the press-fit terminal and the board in the case of press-fitting, and consideration is not given to the damage caused on the board when the press-fit terminal is press-fitted into the through-hole. Therefore, when the terminal density is increased, an interval between the through-holes is shortened. Therefore, the aforementioned development of the length of the damaging portion becomes a big obstacle when the reliability of insulation of the board is enhanced. As a result, in order to use the device in the environment of high temperature, it must be designed that an interval between the through-holes is extended. Alternatively, it must be designed that an intensity of the holding force of the press-fit terminal is low.

Contrary to the above conventional example, in the embodiment of the invention in which elastic material is filled into the resin, when the press-fit terminal is press-fitted into the through-hole, as shown in FIG. 5, even if an intensity of the generated stress, which is given to the board, increases, it is possible to suppress the development of the length of the damaging portion. Therefore, it is possible to obtain a board capable of resisting the stress given to the board in the case of press-fitting. Therefore, even if the through-hole interval is shortened, the reliability of insulation of the board can be guaranteed.

For example, in the case where the through-hole interval (the interval between the end portions) is 300 µm, the limit of the length of a damaging portion is 150 µm. In FIG. 5, the hatched portion is a region in which the allowable damage length region is shown. In the case of the board of the conventional example, for example, when the through-hole interval is designed to be 300 µm so as to obtain the reliability of necessary insulation, an intensity of the holding force of the press-fit terminal must be decreased so as to reduce an intensity of the stress generated in the process of press-fitting. Usually, when the terminal is press-fitted into the through-hole, an intensity of the generated stress must be 400 to 500 N/mm². Therefore, the board of the conventional example can not satisfy the requirement. In this connection, in FIG. 5, this generated stress is represented by the reference mark $f_1$.

On the other hand, in the case of the board of the embodiment, since the board is made of resin into which elastic material is filled, when the external stress given to the board is absorbed and relieved, the strength of the board is enhanced. As a result, as shown by stress $f_2$ in FIG. 5, for example, even if the stress corresponding to 600 µm is given, it is possible to suppress the length of a damaging portion to be not more than 150 µm. Therefore, the aforementioned requirement can be sufficiently satisfied.

In the above explanations, the resin of the entire wiring board is filled with elastic material. However, since a portion, in which the external stress given to the board must be absorbed and relieved, is a portion close to the press-fit entrance of the through-hole formed on the board, only the resin of the surface portion of the board may be filled with elastic material.

In the case where an intensity of the stress generated in the process of press-fitting the terminal is high, in addition to filling the elastic material into the resin, it is possible to use metal (for example, nickel, palladium, rhodium or the like) harder than copper as conductive material to be provided on the inner face of the through-hole, so that a portion of the stress generated in the process of press-fitting the terminal into the through-hole can be born by the hard metal and stress concentration can be dispersed so as to enhance the stress-resistant performance and the reliability of the board.

In this connection, each embodiment described above is a case which is applied to a control circuit device of electronic equipment mounted on an automobile. However, it should be noted that the present invention is not limited to the above specific embodiment. The present invention can be applied in the same manner to other circuit boards such as a control circuit board of the labor saving apparatus, a control circuit board of the communication device or the like, and the same effect can be provided.

As described above, the press-fit terminal of the present invention has the two-step elasticity characteristic in which an intensity of the elastic force of the introducing part of the terminal is made lower than an intensity of the elastic force of the pressure retaining part. Therefore, when the terminal is press-fitted into the through-hole formed on the board, a burden (load) given to the peripheral portion of the opening of the through-hole can be suppressed.

Press-fitting is not conducted in such a manner that an intensity of the pushing force given to the press-fit terminal is decreased in the case of press-fitting the introducing part and increased in the case of press-fitting the pressure retaining part but the press-fit terminal itself has the two-step elasticity characteristic. Therefore, the press-fitting motion can be conducted when a constant intensity of pushing force is given to the press-fit terminal from the start to the completion of press-fitting. Therefore, a burden given to the board can be suppressed in the process of press fitting.

According to the press-fit terminal of the present invention, an intensity of the elastic force of the pressure retaining part of the terminal concerned is sufficiently high when the press-fit terminal is press-fitted into the through-hole. Therefore, even when a common board, the through-hole diameter tolerance of which is not strictly controlled, is used as it is, no burden is given to the board. In addition to that, the terminal concerned can positively hold the board. Further, an electrical connection of the terminal with the wiring provided on the board can be positively ensured.

Further, an intensity of the load given to the press-fit terminal in the case of insertion is reduced by half. Therefore, an output of the insertion jig of inserting the press-fit terminal can be lowered.

According to the press-fit joining wiring board of the present invention, the elastic material is filled into the resin for combining the sheet-like base material of the board. Therefore, without changing a profile of the press-fit terminal press-fitted into the through-hole, the same intensity of the holding force as that of the conventional press-fit joining can be ensured, so that the reliability of insulation between the through-holes can be enhanced. Therefore, the press-fit joining wiring board can be used for a control board of an electronic control equipment arranged in the severe environment of high temperature, high humidity and intense vibration.

When the elastic material is filled into the resin of the board, it is possible to absorb and relieve the external stress given to the board. Accordingly, while the conventional terminal is being used, that is, without making improvements in the conventional terminal, effects can be provided. Conventionally, in order to control a press-fitting margin, for example, the diameter tolerance of the hole formed on the printed wiring board must be in a range of 50 µm. However, according to the invention, it is possible to control the diameter tolerance of the hole formed on the printed wiring board in a range from 150 µm to 200 µm. Accordingly, the degree of freedom of designing can be enhanced. Further, the through-hole interval can be reduced, and electronic components can be highly densely arranged on the control board.

What is claimed is:

1. A press-fit terminal press-fitted in a direction of a terminal axis into a through-hole provided on a wiring board, the press-fit terminal comprising:
    a body part having a smallest cross section; a pressure retaining part; an introducing part having a smallest cross section; and a forward end part having a smallest cross section, the body part, the pressure retaining part, the introducing part, and the forward end part being formed into an integrated body, wherein the smallest cross section of the body part is larger than the smallest cross section of the introducing part and the smallest cross section the forward end, wherein
    an elongated aperture extending in the terminal axis is formed at a center of the pressure retaining part, a portion of the introducing part, and a portion of the body part, wherein
    a cross section not including the aperture of the pressure retaining part is larger than a cross section not including the aperture of the introducing part, wherein said pressure retaining part is configured to exert a first elastic force for holding the press-fit terminal when the press-fit terminal is press-fitted into the through-hole, and wherein said introducing part is configured to exert a second elastic force having a second intensity lower than a first intensity of the first elastic force, when said press-fit terminal is being pressed into the through-hole.

2. A press-fit terminal according to claim 1, wherein when a region of said elongated aperture corresponding to said introducing part is being narrowed gradually in the axial direction toward said forward end part, the cross-sectional area of the introducing part is adjusted.

3. A press-fit terminal according to claim 1, wherein said elongated aperture has a first opening area corresponding to the pressure retaining part and a second opening area corresponding to said introducing part, wherein the second opening area is larger than the first opening area.

4. A press-fit terminal according to claim 1, wherein said wiring board is composed of a laminated board on which a plurality of glass fiber sheets are multiply laminated, and printed wiring is provided on the surface.

5. A press-fit terminal according to claim 1, wherein said wiring board is made of a plurality of sheets consisting of fibers multiply laminated by resin, and has through-holes in thickness direction of the wiring board, each of the through-holes press-fitting a press-fit terminal, and elastic particulates are contained in the resin for combining the sheets in a surface layer portion of the wiring board.

6. An electronic equipment comprising:
a wiring board having a through-hole; and a press-fit terminal press-fitted into and held by the through-hole in a direction of a terminal axis, wherein
the press-fit terminal comprising: a body part, a pressure retaining part, and introducing part and a forward end part, which are formed into an integrated body, wherein a smallest cross section of the body part is larger than a smallest cross section of the introducing part and a smallest cross section the forward end, wherein an elongated aperture having a hexagonal shape extending in the terminal axis is formed at a center of the pressure retaining part, a portion of the introducing part, and a portion of the body part, wherein a cross section not including the aperture of the pressure retaining part is larger than a cross section not including the aperture of the introducing part, wherein said pressure retaining part is configured to exert a first elastic force for holding the press-fit terminal, when the press-fit terminal is press-fined into the through-hole; and wherein said introducing part is configured to exert a second elastic force having a second intensity lower than a first intensity of the first elastic force, when said press-fit terminal is being pressed into the through-hole.

7. An electronic equipment according to claim 6, wherein said wiring board is made of a plurality of sheets consisting of fibers multiply laminated by resin, and has through-holes in thickness direction of the wiring board, each of the through-holes press-fitting a press-fit terminal, and elastic particulates are contained in the resin for combining the sheets in a surface layer portion of the wiring board.

8. An electronic equipment according to claim 7, wherein said elastic particulates are made of one of acrylic rubber, silicon rubber and nitride butadiene rubber or the elastic particulates are made of a combination in which a plurality of the rubber materials are combined with each other.

9. An electronic equipment according to claim 7, wherein an inner circumferential face of said through-hole is made of metal, the hardness of which is higher than that of copper.

* * * * *

UNITED STATES PATENT AND TRADEMARK OFFICE
CERTIFICATE OF CORRECTION

PATENT NO. : 7,491,897 B2
APPLICATION NO. : 10/675227
DATED : February 17, 2009
INVENTOR(S) : Hiromichi Watanabe et al.

It is certified that error appears in the above-identified patent and that said Letters Patent is hereby corrected as shown below:

On the Title Page

Item (57) ABSTRACT, line 3      Delete "case of a press-fitting", Insert --case of press-fitting--

In the Claims

Column 17, lines 34-35, Claim 6      Delete "comprising: a body part, a pressure retaining part, and introducing part", Insert --comprises: a body part, a pressure retaining part, an introducing part--

Column 18, line 14, Claim 6      Delete "is press-fined", Insert --is press-fitted--

Signed and Sealed this

Fifteenth Day of September, 2009

David J. Kappos
*Director of the United States Patent and Trademark Office*